United States Patent [19]

Ishibashi

[11] Patent Number: 5,420,544
[45] Date of Patent: May 30, 1995

[54] SEMICONDUCTOR INTEGRATED CIRCUIT, METHOD OF DESIGNING THE SAME AND METHOD OF MANUFACTURING THE SAME

[75] Inventor: Atsuhiko Ishibashi, Hyogo, Japan

[73] Assignee: Mitsubishi Denki Kabushiki Kaisha, Tokyo, Japan

[21] Appl. No.: 130,727

[22] Filed: Oct. 4, 1993

[30] Foreign Application Priority Data

Dec. 28, 1992 [JP] Japan .................................. 4-348434

[51] Int. Cl.⁶ ............................................. H03L 7/00
[52] U.S. Cl. ........................................ 331/11; 331/25; 331/1 A; 331/14; 326/93; 327/12; 327/156; 327/293; 364/490
[58] Field of Search ..................... 331/1 A, 11, 25, 27, 331/14; 307/269, 262, 303.1, 480, 465, 511; 328/63, 55; 257/202, 208; 364/489, 490

[56] References Cited

U.S. PATENT DOCUMENTS

| | | | |
|---|---|---|---|
| 5,075,575 | 12/1991 | Shizukuishi et al. | 307/465 |
| 5,122,679 | 6/1992 | Ishii et al. | 307/269 |
| 5,124,569 | 6/1992 | Phillips | 307/262 |
| 5,150,068 | 9/1992 | Kawashima et al. | 328/155 |
| 5,204,555 | 4/1993 | Graham et al. | 307/465 |
| 5,270,592 | 12/1993 | Takahashi et al. | 307/482.1 |

OTHER PUBLICATIONS

IEEE Journal of Solid-State Circuits, vol. SC-22, No. 2, Apr. 1987, Deog-Kyoon Jeong, et al., pp. 255–261, "Design of PLL-Based Clock Generation Circuits".

Primary Examiner—Robert J. Pascal
Assistant Examiner—Arnold Kinkead
Attorney, Agent, or Firm—Oblon, Spivak, McClelland, Maier & Neustadt

[57] ABSTRACT

A skew due to distribution of a clock inside a gate array is reduced. Phase comparators (14A), (14B) and (14C) are prepared in the peripheral portion of an internal circuit 71. The phase comparator (14C) is selected which is located nearest an element (77C) which receives an internal clock signal (65C) which is to be synchronized in terms of phase with an external clock signal (73). The selected phase comparator (14C) is connected to a charge pump circuit (16). Without forming a plurality of PLL circuits except for the phase comparators, the phase of any desired internal clock signal is synchronized with the phase of the external clock signal.

29 Claims, 8 Drawing Sheets

SEMICONDUCTOR INTEGRATED CIRCUIT, METHOD OF DESIGNING THE SAME AND METHOD OF MANUFACTURING THE SAME

BACKGROUND OF THE INVENTION

1. Field of the Invention

The present invention relates to a semiconductor integrated circuit comprising a phase-locked-loop circuit, and particularly, to a master-slice type semiconductor integrated circuit such as a gate array.

2. Description of the Prior Art

In general, in a single device which is comprised of a plurality of semiconductor integrated circuits (hereinafter "LSI"), it is necessary to assure synchronization of phase between the plurality of LSIs by use of a common clock signal. In this case, the phase of the common clock signal arrived at an internal circuit of one LSI is different from the phase of the common signal arrived at an internal circuit of other LSI. In addition, even within the internal circuit of the same LSI, depending on the arrangement of elements within the LSI, the phases of clock signals supplied to the respective elements become different from each other. Of these phase differences, which presents a problem in terms of circuit operation, the former is known as an inter-chip skew and the latter is known as an inner-chip skew.

According to a method proposed as a solution of the inter-chip skew, a phase-locked-loop circuit (hereinafter "PLL circuit") is provided in each LSI and the phase of a clock within the LSI is monitored and synchronized to the phase of a common clock signal. Such a technique is disclosed in, for example, Japanese Patent Laid-Open Gazette No. 2-224104.

FIG. 9 is a plan view showing a circuit structure of a plurality of LSIs which are arranged on a circuit board. FIG. 9 explains the proposed method above. LSIs 70A, 70B and 70C comprise internal circuits 71A, 71B and 71C, PLL circuits 72A, 72B and 72C, and driver circuits 76A, 76B and 76C, respectively.

An external clock signal 73 is supplied commonly to the LSIs 70A, 70B and 70C. The internal circuits 71A, 71B and 71C are connected with each other by a bus line 74.

In the LSI 70A, a clock signal is supplied from the driver circuit 76A to the internal circuit 71A wherein it is distributed to elements which are formed within the internal circuit 71A. One of the distributed clock signals is monitored as an internal clock signal 75A. That is, the internal clock signal 75A is inputted to the PLL circuit 72A and its phase is compared with the phase of the external clock signal 73. The PLL circuit 72A and the driver circuit 76A operate so as to synchronize the phase of the internal clock signal 75A to the phase of the external clock signal 73.

This is also performed within the other LSIs 70B and 70C respectively on internal clock signals 75B and 75C by the PLL circuits 72B and 72C and the driver circuits 76B and 76C. Hence, the phases of the internal clock signals 75A, 75B and 75C which are respectively used in the LSIs 70A, 70B and 70C are commonly synchronized to the phase of the external clock signal 73, with a result that the inter-chip skew is improved.

Having such a construction as above, conventional LSIs can improve the inter-chip skew. However, the inner-chip skew still remains as a problem within each one of the internal circuits 71A, 71B and 71C. The internal circuit 71A is taken as an example wherein the internal clock signal 75A taken from a certain element of the internal circuit 71A is synchronized in terms of phase to the external clock 73. In the internal circuit 71A, the closer the element is to the driver circuit 76A, the greater phase lead the clock signal has with respect to the external clock. Conversely, the farther the element is from the element from which the internal clock signal 75A was taken, the greater phase lag the clock signal has with respect to the external clock.

Hence, if the element from which the internal clock signal 75A is taken is selected optionally, in the worst event, the inter-chip skews between the LSIs will increase by the amount of the inner-chip skew. For this reason, in selecting an element wherefrom the internal clock signal 75A is taken, it is necessary to standardize between the LSIs what phase of the inner-chip skew the clock to be selected is to have.

However, since the internal circuit 71A is automatically arranged and wired to form a gate array, or a semicustom device, depending on the arrangement of the elements, not only the inner-chip skew will increase but also the location of an element from which the internal clock signal 75A is taken changes. Hence, the range of distribution of the inner-chip skew with respect to the external clock signal 73 cannot be set as desired, making it impossible to sufficiently control the inter-chip skew.

A solution of this problem is to insert a delay circuit between the internal circuit 71A and the PLL circuit 72A after the internal circuit 71A is arranged and wired, to delay of the internal clock 75A and to adjust the phase difference. In this case, however, the phases cannot be adjustment properly if a delay created by the delay circuit is changed due to, for instance, heating up of the LSI.

SUMMARY OF THE INVENTION

In a first aspect of apparatus of the present invention, a semiconductor integrated circuit which is divided into a first region and a second region, the semiconductor integrated circuit comprises: at least one internal circuit disposed within the first region, the internal circuit including a plurality of elements, the internal circuit receiving a basic clock signal and providing internal clock signals to the elements; phase adjusting means disposed within the first region in correspondence to the internal circuit; and a plurality of phase comparing means candidates disposed within the second region in correspondence to the elements, one of the plurality of phase comparing means candidates being selected as phase comparing means. The phase comparing means receives one of the internal clock signals and an external clock signal which has a reference phase with respect to the one of the internal clock signal is to be synchronized, and outputs a phase difference signal which represents a phase difference between the one of the internal clock signals and the external clock signal. Each phase adjusting means receives the phase difference signal and adjusts the phase difference to a predetermined value.

Preferably, the phase comparing means candidates are disposed in correspondence to a group of the elements to which the internal clock signals respectively having the same phase difference from the phase of the external clock signal.

Preferably, one of each phase comparing means candidate is disposed in correspondence to each one of the elements.

Preferably, the second region is surrounded by the first region.

Preferably, the semiconductor integrated circuit further comprises in the first region a driver circuit which is connected to the phase adjusting means and which generates the basic clock signal.

The phase adjusting means preferably includes a charge pump circuit which receives the phase difference signal and outputs a pulse signal which has a pulse width which corresponds to the phase difference signal.

Further, the phase comparing means candidates which are located relatively far from the charge pump each includes a semiconductor device having a relatively high driving capability at the end stage thereof, and the phase comparing means candidates which are relatively located relatively near the charge pump each includes a semiconductor device having a relatively low driving capability at the end stage thereof.

The phase adjusting means may further include a loop filter which receives, smooths and outputs the pulse signal.

The phase adjusting means may further include an oscillator for oscillating a signal which has a phase which varies in accordance with a potential which is outputted by the loop filter, and the basic clock signal is generated based on the signal oscillated by the oscillator.

In a first aspect of designing method of the present invention, the method comprises the steps of: (a) specifying a subject region to be designed; (b) dividing the subject region into a first region and a second region; (c) designing in the first region: at least one internal circuit which includes a plurality of elements, the internal circuit receiving a basic clock signal and providing internal clock signals to the elements; and phase adjusting means which corresponds to the internal circuit; (d) in the second region, designing a plurality of phase comparing means candidates which correspond to the elements, one of the plurality of phase comparing means candidates being selected as phase comparing means; (e) specifying one of the at least one internal circuit which receives one of the internal clock signals which is to be adjusted in terms of phase; and (f) specifying one of the phase comparing means candidates which corresponds to the one of the internal circuits as the phase comparing means. In response to the one of the internal clock signals which is given to the one of the at least one internal circuit and an external clock signal which has a reference phase with respect to the one of the internal clock signals is to be synchronized, the phase comparing means outputs a phase difference signal which represents a phase difference between the one of the internal clock signals and the external clock signal. Each phase adjusting means receives the phase difference signal and adjusts the phase difference to a predetermined value.

Preferably, the phase adjusting means includes a charge pump circuit which receives the phase difference signal and outputs a pulse signal which has a pulse width which corresponds to the phase difference signal, the phase comparing means includes a semiconductor element at the output stage thereof, and the method further comprises the step of (g) redesigning so that the semiconductor element has a larger driving capability if one of the phase comparing means candidates which is located relatively far from the charge pump circuit is selected as the phase comparing means than if one of the phase comparing means candidates which is located relatively near the charge pump circuit is selected as the phase comparing means.

In a second aspect of designing method of the present invention, the method comprises the steps of: (a) specifying a subject region to be designed; (b) dividing the subject region into a first region and a second region; (c) designing in the first region: at least one internal circuit which includes a plurality of elements, the internal circuit receiving a basic clock signal and providing internal clock signals to the elements; and phase adjusting means which corresponds to the internal circuit; (d) in the second region, designing a plurality of third regions one of which is to be specified as a mounting location at which phase comparing means is to be disposed; (e) specifying one of the at least one internal circuit which receives one of the internal clock signals which is to be adjusted in terms of phase; and (f) designing the phase comparing means at one of the third regions which corresponds to the one of the internal circuits. In response to the one of the internal clock signals which is given to the one of the at least one internal circuit and an external clock signal which has a reference phase with respect to the one of the internal clock signals is to be synchronized, the phase comparing means outputs a phase difference signal which represents a phase difference between the one of the internal clock signals and the external clock signal. Each phase adjusting means receives the phase difference signal and adjusts the phase difference to a predetermined value.

In a first aspect of manufacturing method of the present invention, the method comprises the steps of: (a) specifying a subject region on a semiconductor substrate; (b) dividing the subject region into a first region and a second region; (c) forming in the first region: at least one internal circuit which includes a plurality of elements, the internal circuit receiving a basic clock signal and providing internal clock signals to the elements; and phase adjusting means which corresponds to the internal circuit; (d) in the second region, forming a plurality of phase comparing means candidates which correspond to the elements, one of the plurality of phase comparing means candidates being selected as phase comparing means; (e) specifying one of the at least one internal circuit which receives one of the internal clock signals which is to be adjusted in terms of phase; (f) specifying one of the phase comparing means candidates which corresponds to the one of the internal circuits as the phase comparing means; and (g) connecting the phase comparing means to the phase adjusting means. In response to the one of the internal clock signals which is given to the one of the at least one internal circuit and an external clock signal which has a reference phase with respect to the one of the internal clock signals is to be synchronized, the phase comparing means outputs a phase difference signal which represents a phase difference between the one of the internal clock signals and the external clock signal. Each phase adjusting means receives the phase difference signal and adjusts the phase difference to a predetermined value.

In a second aspect of manufacturing method of the present invention, the method comprises the steps of: (a) specifying a subject region on a semiconductor substrate; (b) dividing the subject region into a first region and a second region; (c) forming in the first region: at least one internal circuit which includes a plurality of elements, the internal circuit receiving a basic clock signal and providing internal clock signals to the elements; and phase adjusting means which corresponds to the internal circuit; (d) in the second region, specifying a plurality of third regions one of which is to be specified as a mounting location at which phase comparing means is to be disposed; (e) specifying one of the at least one internal circuit which receives one of the internal clock signals which is to be adjusted in terms of phase; and (f) forming the phase comparing means at one of the third regions which corresponds to the one of the internal clock circuits; and (g) connecting the phase comparing means to the phase adjusting means. In response to the one of the internal clock signals which is given to the one of the at least internal circuit and an external clock signal which has a reference phase with respect to the one of the internal clock signals is to be synchronized, the phase comparing means outputs a phase difference signal which represents a phase difference between the one of the internal clock signals and the external clock signal, and each phase adjusting means receives the phase difference signal and adjusts the phase difference to a predetermined value.

In a second aspect of apparatus of the present invention, a semiconductor integrated circuit which is divided into a first region and a second region, the semiconductor integrated circuit, comprises: at least one internal circuit disposed within the first region, the internal circuit including a plurality of elements, the internal circuit receiving a basic clock signal and providing internal clock signals to the elements; phase adjusting means and first phase comparing means disposed within the first region in correspondence to the internal circuit; and a plurality of phase comparing means candidates disposed within the second regions in correspondence to the elements, one of the plurality of phase comparing means candidates being selected as second phase comparing means. The second phase comparing means receives one of the internal clock signals and an external clock signal which has a reference phase with respect to the one of the internal clock signals is to be synchronized, and outputs a plurality of transition signals which represents transitions of the one of the internal clock signals and the external clock signal. The first phase comparing means, in response to the transition signals, outputs a phase difference signal which represents a phase difference between the one of the internal clock signals and the external clock signal, and each phase adjusting means receives the phase difference signal and adjusts the phase difference to a predetermined value.

Preferably, the one of the internal clock signals and the external clock signal both have a first value or a second value which are different from each other, and the transition signals have: a first signal for performing second transition at first transition of the external clock signal, the first transition being a transition from the first value to the second value, the second transition being a transition from the second value to the first value; a second signal for performing the second transition at the first transition of the one of the internal clock signals; and a third signal for performing the first transition at a later one of the second transition of the first signal and the second transition of the second signal.

Further, the phase difference signal may have: a fourth signal for performing the first transition at the second transition of the first signal; and a fifth signal for performing the first transition at the second transition of the second signal. After performing the first transition, the fourth signal performs the second transition in response to the first transition of the third signal. After performing the first transition, the fifth signal performs the second transition in response to the first transition of the third signal.

Preferably, the phase adjusting means: in response to the first and the second transitions of the fourth signal, causes the phase of the basic clock signal to lead; and in response to the first and the second transitions of the fifth signal, causes the phase of the basic clock signal to lag behind.

The second phase comparing means preferably comprises: a first gate which is controlled by the fourth signal and which generates the first signal from the external clock signal; a second gate which is controlled by the fifth signal and which generates the second signal from one of the internal clock signals; a first flip-flop which is set by the first signal and reset by the third signal; a second flip-flop which is set by the second signal and reset by the third signal; and a third gate for generating the third signal from outputs of the first and the second flip-flops, the first signal and the second signal.

The first phase comparing means preferably comprises: a fourth gate for generating the fourth signal from the first signal, the third signal and an output of the first flip-flop; and a fifth gate for generating the fifth signal from the second signal, the third signal and an output of the second flip-flop.

Further, the first and the second gates may be NAND gates.

Further, the third gate may be an NAND gate.

Further, the fourth and the fifth gates may be NAND gates.

The first flip-flop preferably comprises: a sixth gate including a first input terminal for receiving the first signal, a second input terminal and an output terminal for providing the fourth gate with an inversion of logical products which are received at its first and the second input terminals; and a seventh gate including a first input terminal for receiving the third signal, a second input terminal connected to the output terminal of the sixth gate and an output terminal for providing the second input terminal of the sixth gate with an inversion of logical products which are received at its first and the second input terminals.

The second flip-flop preferably comprises: an eighth gate including a first input terminal for receiving the second signal, a second input terminal and an output terminal for providing the fifth gate with an inversion of logical products which are received at its first and the second input terminals; and a ninth gate including a first input terminal for receiving the third signal, a second input terminal connected to the output terminal of the eighth gate and an output terminal for providing the second input terminal of the eighth gate with an inversion of logical products which are received at its first and the second input terminals.

In a third aspect of designing method of the present invention, the method comprises the steps of: (a) specifying a subject region to be designed; (b) dividing the subject region into a first region and a second region; (c) designing in the first region: at least one internal circuit which includes a plurality of elements, the internal circuit receiving a basic clock signal and providing internal clock signals to the elements; and phase adjusting means and first phase comparing means both of which correspond to the internal circuit; (d) in the second region, designing a plurality of phase comparing means candidates which correspond to the elements, one of the plurality of phase comparing means candidates being selected as second phase comparing means; (e) specifying one of the at least one internal circuit which receives one of the internal clock signals which is to be adjusted in terms of phase; and (f) specifying one of the phase comparing means candidates which corresponds to the one of the internal circuits as the second phase comparing means. The second phase comparing means receives the one of the internal clock signals and an external clock signal which has a reference phase with respect to the one of the internal clock signals is to be synchronized, and outputs a plurality of transition signals which represent transitions of the one of the internal clock signals and the external clock signal. The first phase comparing means in response to the transition signal outputs a phase difference signal which represents a phase difference between the one of the internal clock signals and the external clock signal, and each phase adjusting means receives the phase difference signal and adjusts the phase difference to a predetermined value.

In a fourth aspect of designing method of the present invention, the method comprises the steps of: (a) specifying a subject region to be designed; (b) dividing the subject region into a first region and a second region; (c) designing in the first region: at least one internal circuit which includes a plurality of elements, the internal circuit receiving a basic clock signal and providing internal clock signals to the elements; and phase adjusting means and first phase comparing means both of which correspond to the internal circuit; (d) in the second region, designing a plurality of third regions one of which is to be specified as a mounting location at which second phase comparing means is to be disposed; (e) specifying one of the at least one internal circuit which receives one of the internal clock signals which is to be adjusted in terms of phase; and (f) designing the second phase comparing means at one of the third regions which corresponds to the one of the internal circuits. The second phase comparing means receives the one of the internal clock signals and an external clock signal which has a reference phase with respect to the one of the internal clock signals is to be synchronized, and outputs a plurality of transition signals which represent transitions of the one of the internal clock signals and the external clock signal. The first phase comparing means in response to the transition signal outputs a phase difference signal which represents a phase difference between the one of the internal clock signals and the external clock signal, and each phase adjusting means receives the phase difference signal and adjusts the phase difference to a predetermined value.

In a third aspect of manufacturing method of the present invention, the method comprises the steps of: (a) specifying a subject region to be designed; (b) dividing the subject region into a first region and a second region; (c) in the first region, forming: at least one internal circuit which includes a plurality of elements, the internal circuit receiving a basic clock signal and providing internal clock signals to the elements; and phase adjusting means and first phase comparing means both of which correspond to the internal circuit; (d) in the second region, forming a plurality of phase comparing means candidates which correspond to the elements, one of the plurality of phase comparing means candidates being selected as second phase comparing means; (e) specifying one of the at least one internal circuit which receives one of the internal clock signals which is to be adjusted in terms of phase; (f) specifying one of the phase comparing means candidates which corresponds to the one of the internal circuits as the second phase comparing means; and (g) connecting the second phase comparing means, the first phase comparing means and the phase adjusting means in this order. The second phase comparing means receives the one of the internal clock signals and an external clock signal which has a reference phase with respect to the one of the internal clock signals is to be synchronized, and outputs a plurality of transition signals which represent transitions of the one of the internal clock signals and the external clock signal. The first phase comparing means in response to the transition signal outputs a phase difference signal which represents a phase difference between the one of the internal clock signals and the external clock signal, and each phase adjusting means receives the phase difference signal and adjusts the phase difference to a predetermined value.

In a fourth aspect of designing method of the present invention, the method comprises the steps of: (a) specifying a subject region to be designed; (b) dividing the subject region into a first region and a second region; (c) in the first region, forming: at least one internal circuit which includes a plurality of elements, the internal circuit receiving a basic clock signal and providing internal clock signals to the elements; and phase adjusting means and first phase comparing means both of which correspond to the internal circuit; (d) in the second region, specifying a plurality of third regions one of which is to be specified as a mounting location at which second phase comparing means is to be disposed; (e) specifying one of the at least one internal circuit which receives one of the internal clock signals which is to be adjusted in terms of phase; (f) forming the second phase comparing means at one of the third regions which corresponds to the one of the internal circuits; and (g) connecting the second phase comparing means, the first phase comparing means and the phase adjusting means in this order. The second phase comparing means receives the one of the internal clock signals and an external clock signal which has a reference phase with respect to the one of the internal clock signals is to be synchronized, and outputs a plurality of transition signals which represent transitions of the one of the internal clock signals and the external clock signal. The first phase comparing means in response to the transition signal outputs a phase difference signal which represents a phase difference between the one of the internal clock signals and the external clock signal, and each phase adjusting means receives the phase difference signal and adjusts the phase difference to a predetermined value.

According to the first aspect of apparatus, the first and the second aspects of designing method and the first and the second aspects of manufacturing method, of the plurality of phase comparing means candidates, one that is located near the element to receive the internal clock signal which is to be synchronized in terms of phase with the external clock signal is selected as the phase comparing means.

According to the second aspect of apparatus, the third and the fourth aspects of designing method and the third and the fourth aspects of manufacturing method, even if the first and the second phase comparing means are far from each other, the plurality of transition signals are delayed by almost the same amount.

As heretofore described, according to the present invention, the inter-chip skew is prevented from increasing despite the arrangement of circuit elements. Further, compared with where a plurality of PLL circuits are prepared, deterioration in the density of the device is very small. Equally important, influence of a switching noise of a driver circuit is reduced since a voltage oscillation circuit, a charge pump circuit, a loop filter and the like of the PLL circuit, which are analog circuits, need not to be disposed near the driver circuit.

Accordingly, it is an object of the present invention to offer a semiconductor integrated circuit in which the distribution range of inner-chip skew within an internal circuit with respect to an external clock signal can be adjusted as desired without using a delay circuit and which comprises a PLL circuit which selects an internal clock signal to be monitored so that such phase adjustment can be performed even where the internal circuit is formed by automatic arrangement and wiring.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
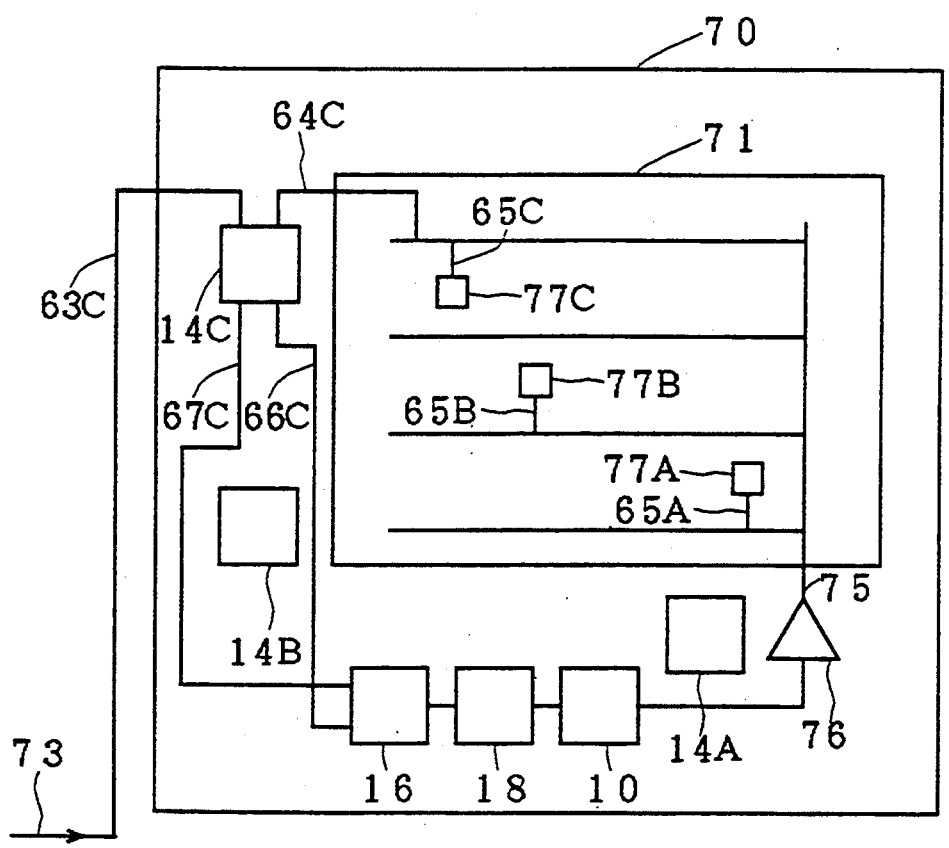
FIGS. 1 and 2 are block diagrams for explaining a first preferred embodiment of the present invention.

FIG. 1 is a block diagram for explaining a first preferred embodiment of the present invention. For simplicity of illustration, of a plurality of LSIs which form a device, only an LSI 70 is shown in FIG. 1.

The LSI 70 comprises an internal circuit 71. Outside the internal circuit 71, there are provided phase comparators 14A, 14B and 14C, a charge pump circuit 16, a loop filter 18, a voltage-controlled oscillator 10 and a driver circuit 76. Inside the internal circuit 71, circuit elements 77A, 77B and 77C are provided.

The driver circuit 76 outputs a basic clock signal 75. The basic clock signal 75 is transferred within the internal circuit 71 so that internal clock signals 65A, 65B and 65C are supplied to the circuit elements 77A, 77B and 77C, respectively.

Since the circuit elements 77A, 77B and 77C are located progressively nearer the driver circuit 76, the internal clock signals 65A, 65B and 65C have progressively larger phase leads. Hence, to synchronize the phase of the internal clock signal 65C, which is lagged behind the phases of the other internal clock signals, to the phase of an external clock signal 73, the phase comparator 14C which is located in the vicinity of the circuit element 77C to which the internal clock signal 65C is given is selected and connected to the charge pump circuit 16.

More particularly, as shown in FIG. 1, wires 63C and 64C are formed through which the external clock signal 73 and the internal clock signal 65C are supplied to the phase comparator 14C while wires 67C and 66C are formed to realize connection between the phase comparator 14C and the charge pump circuit 16.

Figure 3:
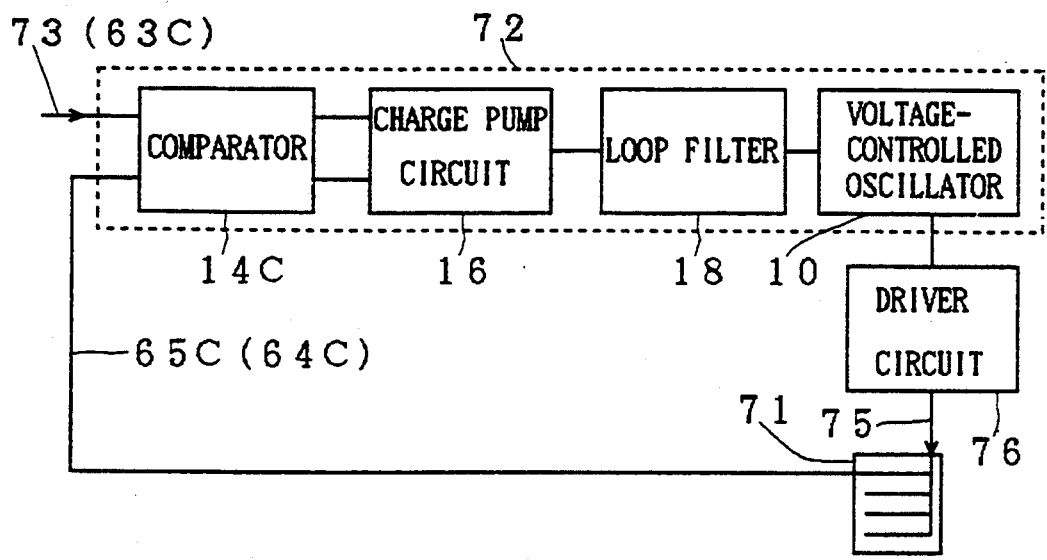
FIG. 3 is a block diagram for explaining operations of the first preferred embodiment of the present invention.
Figure 9:
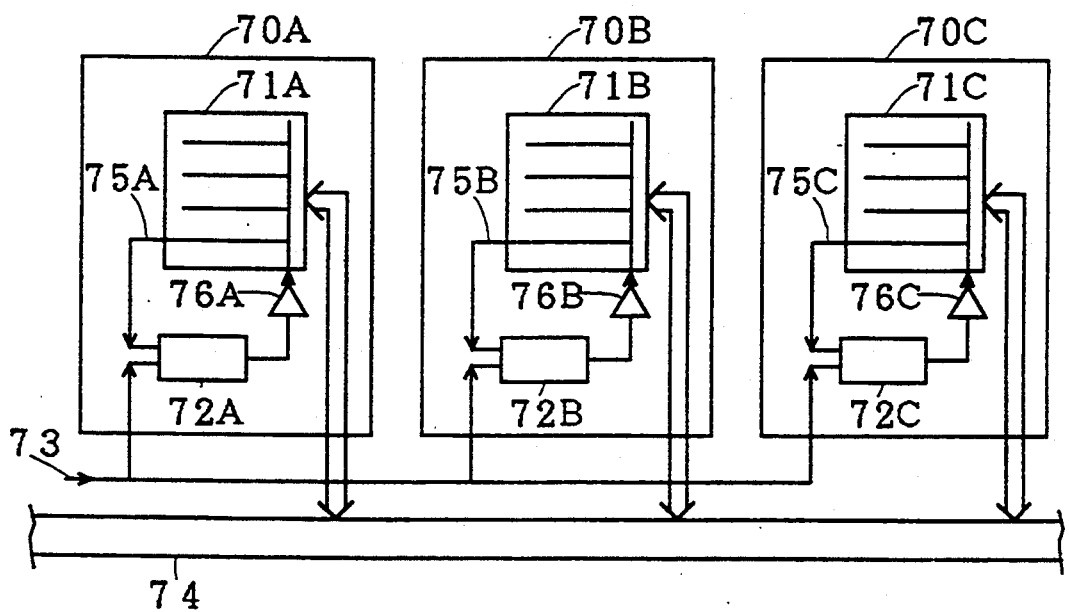
FIG. 9 is a block diagram illustrating a conventional technique.

FIG. 3 is a block diagram for explaining operations involved in connecting the phase comparator 14C to the charge pump circuit 16 and synchronizing the phase of the internal clock signal 65C to the phase of the external clock signal 73. In combination with the phase comparator 14C, the charge pump circuit 16, the loop filter 18, the voltage-controlled oscillator 10 form a PLL circuit 72.

A signal generated by the voltage-controlled oscillator 10 is given to the driver circuit 76 from which the basic clock signal 75 is distributed to the internal circuit 71. The internal clock signal 65C, i.e., the basic clock signal 75 as it is distributed, is supplied to the circuit element 77C and then transferred on the wire 64C to one input terminal of the phase comparator 14C. Although FIG. 3 shows the wire 64C as a long wire for clarity of illustration, in reality, the wire 64C is short since the circuit element 77C and the phase comparator 14C are disposed close to each other as shown in FIG. 1. Hence, a phase difference of the internal clock signal 65C created on the wire 64C is negligible.

The phase comparator 14C compares the phase of the internal clock signal 65C and the phase of the external clock signal 73 which was received on the wire 63C and supplies an up signal or a down signal to the charge pump circuit 16.

The charge pump circuit 16, in response to the up signal or the down signal, outputs a positive or a negative charge as a pulse signal. The loop filter 18, being connected to the charge pump circuit 16, receives, smooths and then outputs the pulse signal. Connected to the loop filter 18, the voltage-controlled oscillator 10 is controlled by the voltage of the output which is given from the loop filter 18. Under the control of the loop filter 18, the voltage-controlled oscillator 10 changes the phase of the basic clock signal 75 it outputs.

As a result, the phase of the internal clock signal 65C becomes close to the phase of the external clock signal 73 despite a delay time created within the driver circuit 76. Upon synchronization of the phases of the two clock signals, the pulse signal having a very narrow pulse width is generated in accordance with the up signal or the down signal which is outputted by the phase comparator 14C. This stabilizes the output voltage of the loop filter 18. Since the output voltage of the loop filter 18 thus stays approximately stable, continued phase synchronization is assured.

The phase of the internal clock signal 65C is synchronized to the phase of the external clock signal 73 in this manner.

Figure 2:
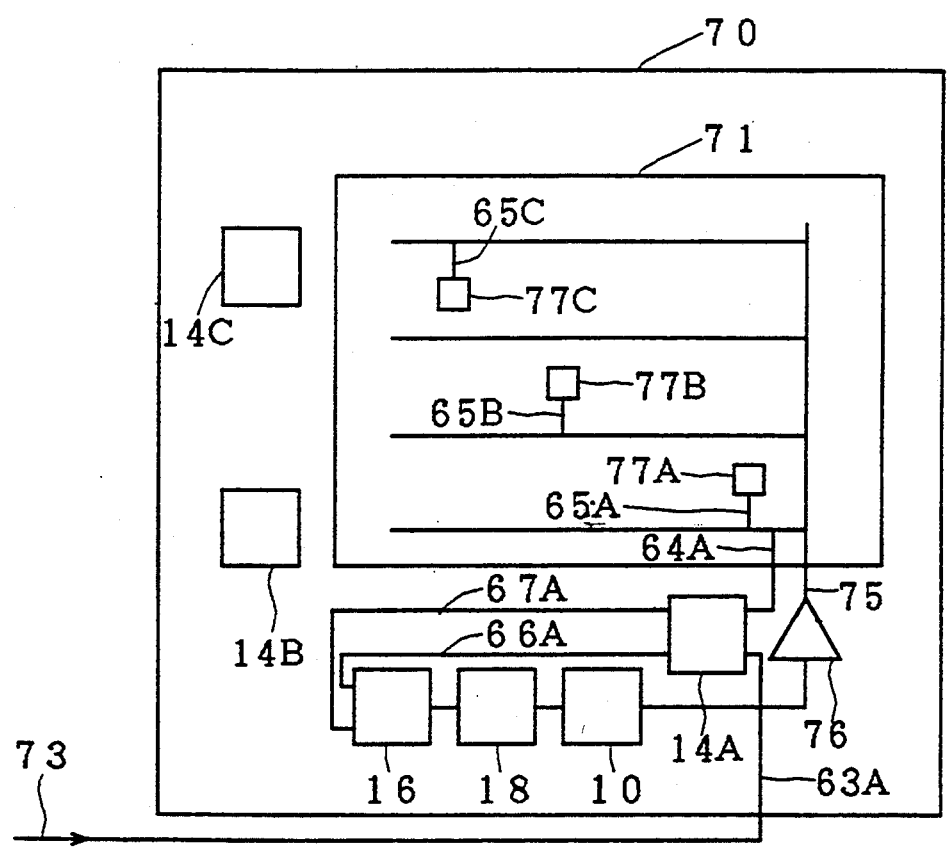

In a similar manner, the phase comparator 14A is selected and connected to the charge pump circuit 16 to synchronize the phase of the internal clock signal 65A, which is supplied to the circuit element 77A which is disposed near the driver circuit 76, to the phase of the external clock signal 73. FIG. 2 is a block diagram showing the connection to be made in such a case.

Wires 64A and 63A are formed which respectively supply the internal clock signal 65A and the external clock signal 73 to the phase comparator 14A. In addition, wires 66A and 67A for connecting the phase comparator 14A to the charge pump circuit 16 are provided. In this case, the PLL circuit 72, though formed by the phase comparator 14A, the charge pump circuit 16, the loop filter 18 and the voltage-controlled oscillator 10, operates in the same manner as that described above, whereby the phase of the internal clock signal 65A is synchronized to the phase of the external clock signal 73.

In the structure above, the phase comparator 14A alone may be disposed near the driver circuit 76 since the phase comparator 14A is a digital circuit and therefore less sensitive to a noise. On the other hand, the charge pump circuit 16, the loop filter 18 and the voltage-controlled oscillator 10, which are susceptible to a noise, may be located far from the driver circuit 76. The PLL circuit adopting such an arrangement is resistant to a noise.

Although not shown, to synchronize the phase of the internal clock signal 65B which is supplied to the circuit element 77B to the phase of the external clock signal 73, the phase comparator 14B is selected and connected to the charge pump circuit 16. In short, it is possible to operate a circuit element of a certain LSI in synchronism with a circuit element of other LSI by selecting within each LSI a phase comparator which is disposed near the circuit element to be synchronized and by forming a PLL circuit. This not only accurately adjust the phases of the clocks used within the internal circuit 71 but also prevents an increase in the inter-chip skews between the LSIs.

Further advantageously, since a number of phase comparators 14A, 14B . . . are disposed and one of them is selected for the sake of phase synchronization, it is not necessary to dispose a plurality of charge pump circuits 16, loop filters 18 and voltage-controlled oscillators 10 to form the PLL circuits. Selection of any of the phase comparators to form the PLL circuits is attained merely by wiring.

The advantage of the present invention is particularly appreciated where the circuit elements 77A, 77B, 77C, . . . are automatically arranged and wired. Wherever a circuit element to be synchronized with other circuit element of other LSI is located by automatic arrangement, by selecting a phase comparator which is the nearest the circuit element to be synchronized and by thus forming the PLL circuit, proper phase synchronization is performed.

FIGS. 1 and 2 show, without any intention to limit the invention, where three phase comparators are formed. Instead, two phase comparators or more than three phase comparators may be provided.

If there is a need on the part of a user to operate a circuit element of a certain LSI and a circuit element of other LSI with a predetermined phase difference therebetween, the phase comparator which is located away from the circuit element to be synchronized may be intentionally selected to form the PLL circuit. For example, if in the LSI of FIG. 1, the phase comparator 14B may be selected to synchronize the phase of the internal clock signal 65B which is supplied to the circuit element 77B to the phase of the external clock signal 73 to eventually control the operation of the circuit element 77C. Thus, the present invention enables flexible control.

According to the present invention, in the semiconductor integrated as it is being designed, or as it is being manufactured, or even as it is completed as a finished product, inclusion or omission of the plurality of phase comparators is totally discretionary. For instance, even if some of the phase comparators included in the design of the semiconductor integrated circuit have eventually failed to be selected, during actual fabrication, wires which form these unselected phase comparators may not be disposed so that the unselected phase comparators are not formed.

Figure 4:
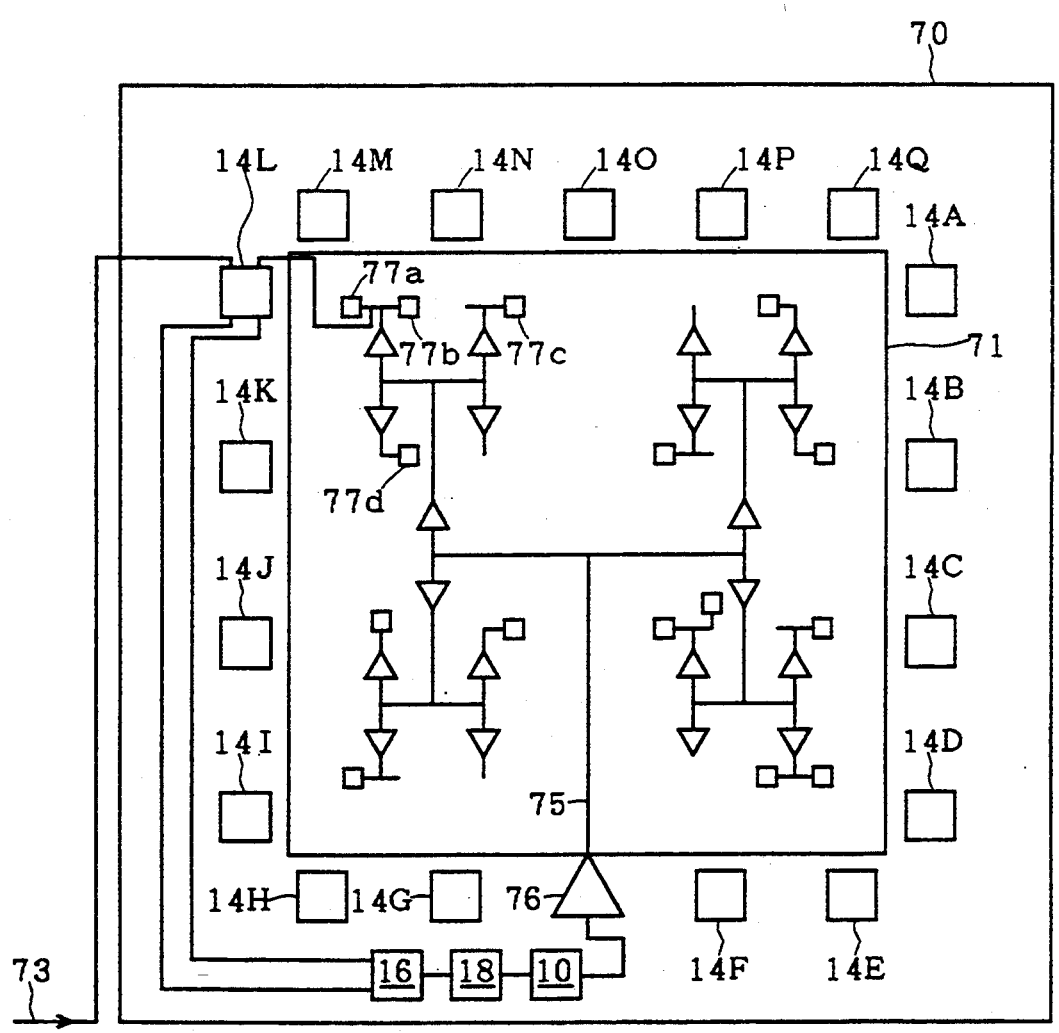
FIGS. 4 and 5 are block diagrams for explaining the first preferred embodiment of the present invention.

FIG. 4 is a block diagram illustrating the first preferred embodiment in relation to where the wires for transmission of the clock signals are formed in a clock-tree distribution. Unlike the LSI of FIG. 1 in which the phase comparators 14A to 14C are disposed along two abutting sides of the internal circuit 71 from the vicinity of the driver circuit 76 to a location which is farthest from the driver circuit 76, in the LSI of FIG. 4, phase comparators 14A to 14Q are located all over the peripheral portion of the internal circuit 71. This is because it is not always the same from which positions the internal clock having the largest phase lead and the internal clock having the largest phase lag can be taken.

Figure 5:
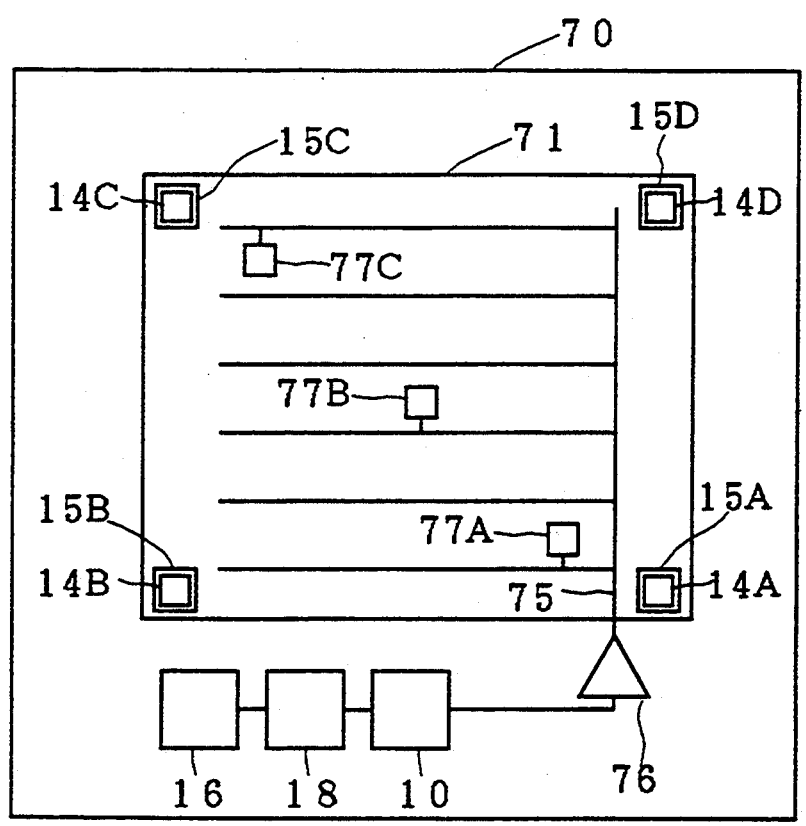

FIG. 5 is a block diagram showing a modification of the first preferred embodiment. As shown in FIG. 5, the phase comparators are not necessarily disposed outside the internal circuit 71. Instead, regions for mounting the phase comparators may be ensured within the internal circuit 71. In the modification shown in FIG. 5, regions 15A, 15B, 15C and 15D are formed to dispose four phase comparators 14A, 14B, 14C and 14D, respectively. That is, what is required here is only to dispose in these regions transistors which are to form the phase comparators, and therefore, it is not necessary to connect the transistors by metallic wires if the phase comparators to be formed by these transistors need not be used.

Second Preferred Embodiment

In the first preferred embodiment, the whole portion of each phase comparator is mounted within each LSI. Instead, of front stages and rear stages of the phase comparators, a plurality of front stages may be used and only one rear stage may be used just like the charge pump circuit 16 and the like.

Figure 6:
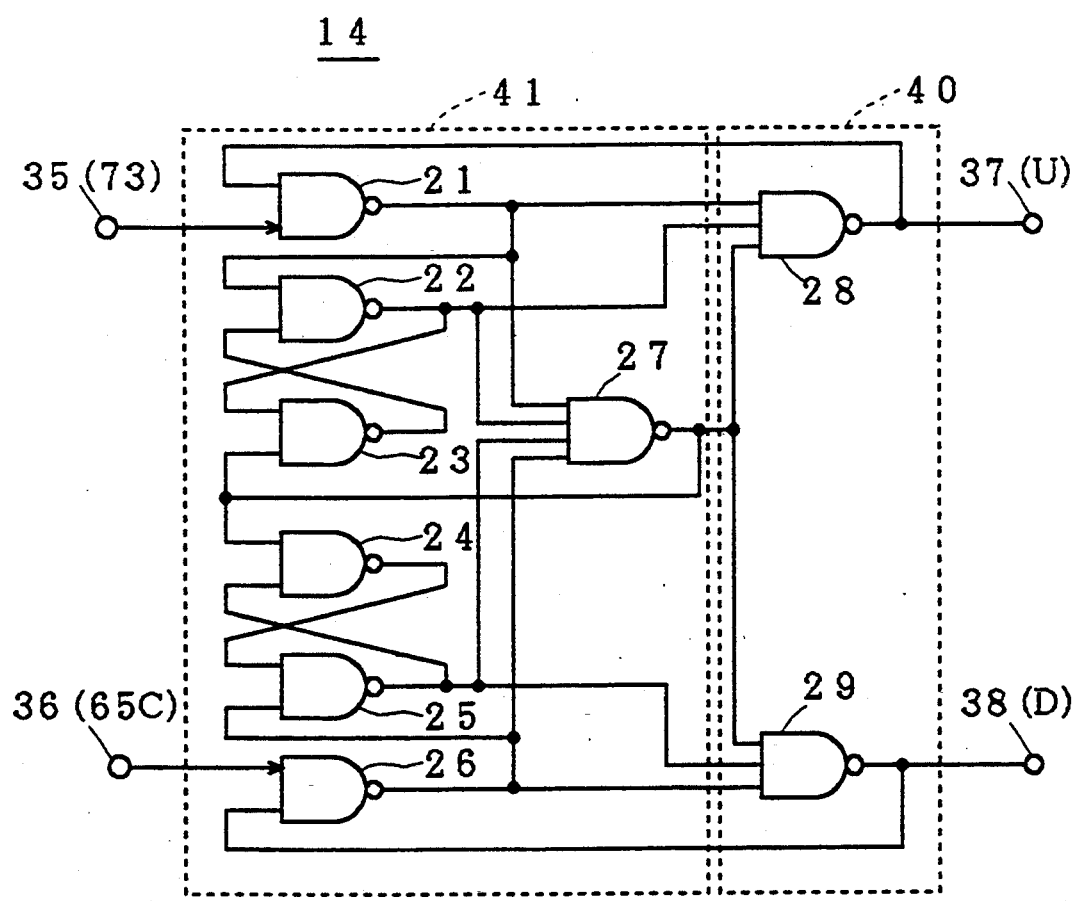
FIG. 6 is a circuitry diagram for explaining a second preferred embodiment of the present invention.

FIG. 6 is a circuitry diagram showing a structure of a phase comparator 14 according to a second preferred embodiment of the present invention. The phase comparator 14 consists of front stages 41 and a rear stage 40. The front stages 41 each comprise 2-input NAND gates 21 to 26 and a 4-input NAND gate 27. The rear stage 40 comprises 3-input NAND gates 28 and 29.

One input terminals of the NAND gates 21 and 26 are respectively connected to input terminals 35 and 36 to receive the external clock signal 73 and an internal clock signal (e.g., a signal 65C). Output terminals of the NAND gates 28 and 29 are respectively connected to output terminals 37 and 38. An up signal U and a down signal D are respectively supplied to the output terminals 37 and 38 which are each connected to the charge pump circuit 16. A phase comparator which comprises the NAND gates 21 to 27 constructed as such is disclosed in Japanese Patent Laid-Open Gazette No. 2-243841, for example.

The phase comparator 14 compares the phases of the signals which are received at the input terminals 35 and 36 (i.e, the external clock signal 73 and the internal clock signal 65C) and outputs a pulse signal (i.e., the up signal U or the down signal D) which has a pulse width which corresponds to a phase difference between the two received signals to the output terminal 37 or 38. The up signal U is outputted as the pulse signal if the internal clock signal 65C has a phase lag. The down signal D as the pulse signal if the internal clock signal 65C has a phase lead.

If wires for transmitting the up signal U and down signal D are long because of a long distance between the phase comparator 14 and the charge pump circuit 16, capacitances of the wires are large. If so, chances are that the pulses of the up signal U and down signal D become less steep, which in turn deteriorates the sensitivity of the phase comparator 14. This presents a problem if the phase comparator 14C far from the charge pump circuit 16 is selected to form the PLL circuit 72 as is done in the first preferred embodiment. The second preferred embodiment is to offer an improved LSI structure to solve such a problem.

More precisely, of the front and the rear stages forming the phase comparator 14, the rear stage 40 is disposed in the vicinity of the charge pump circuit 16 and a plurality of the front stages 41 are disposed in the vicinity of the circuit elements to thereby prevent the pulses of the up signal U and down signal D from becoming less steep. The phase comparator 14, even though having such a structure, would not allow the lengths of the wires for transmitting the signals from the front stages 41 to the rear stage 40 to deteriorate the up signal U and down signal D. The reason is as follows.

Figure 7:
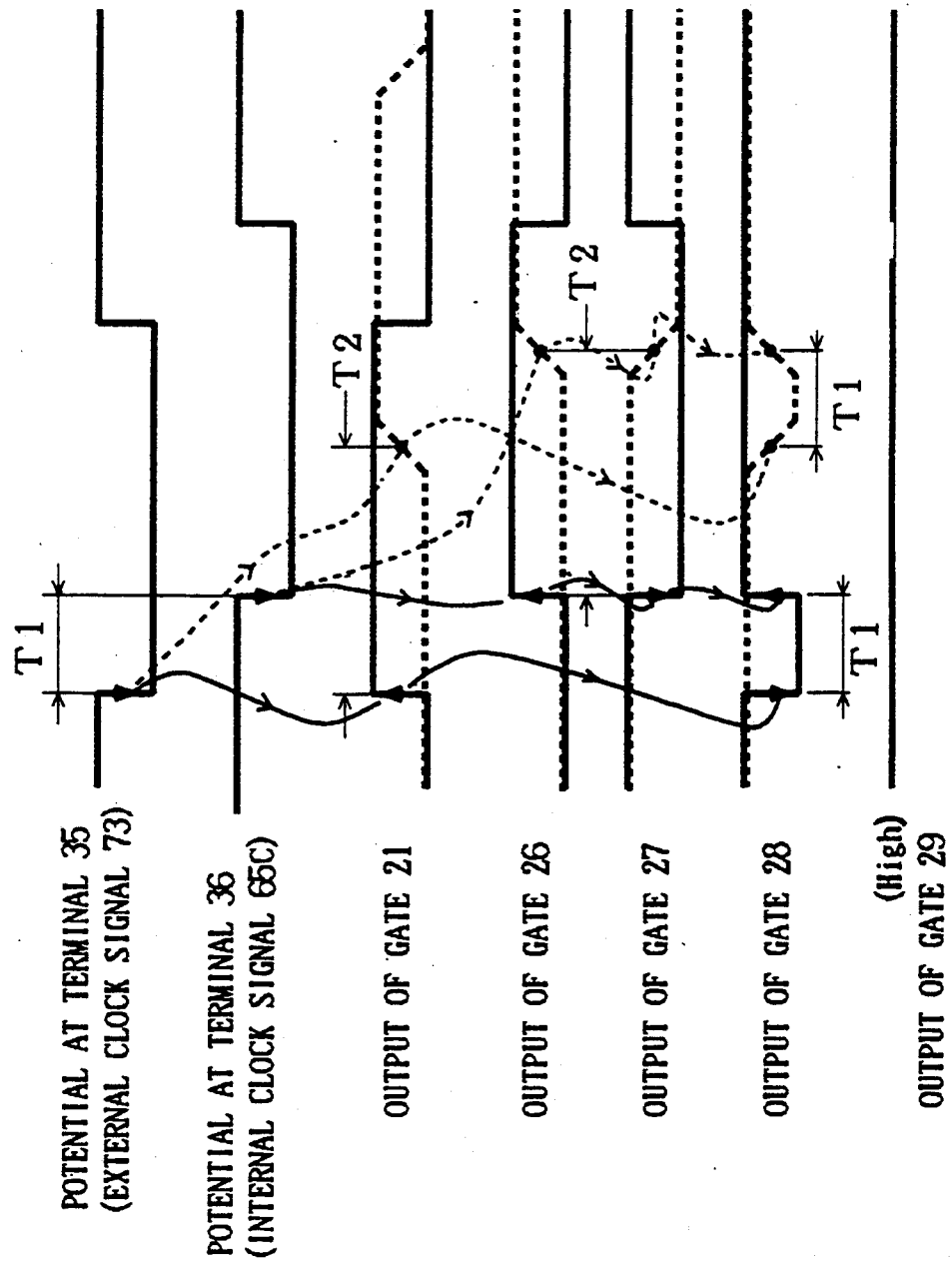
FIG. 7 is a timing chart for explaining the second preferred embodiment of the present invention.

FIG. 7 is a timing chart showing a relation between a potential given to the terminal 35 (i.e., the external clock signal 73), a potential given to the terminal 36 (i.e., the internal clock signal 65C in the LSI structure of FIG. 1) and the potentials of the outputs of the gates 21, 26, 27, 28 and 29.

Prior to explanation of FIG. 7, a case where both the external clock 73 and the internal clock signal 65C are at LOW state will be described. In this case, the gates 21 and 26 both always output HIGH state outputs. If the outputs of the gates 22 and 25 are at HIGH state, the output of the gate 27 becomes LOW and the outputs of the gates 23 and 24 become HIGH, thereby changing the outputs of the gates 22 and 25 to LOW state. Hence, the outputs of the gates 28 and 29 always stay HIGH as far as both the external clock 73 and the internal clock signal 65C are at LOW state. If the external clock 73 and the internal clock signal 65C are at LOW state both turn to HIGH state after this, the outputs of the gates 21 and 26 become LOW and the outputs of the gates 22 and 25 become HIGH.

Next, a subsequent situation where the external clock signal 73 falls and then the internal clock signal 65C falls with a phase lag of T1 with respect to the external clock signal 73 will be now described (FIG. 7). In response to the fall of the external clock signal 73, the output of the gate 21 rises to HIGH state. However, since the internal clock signal 65C remains at HIGH state, the output of the gate 26 stays LOW. Meanwhile, since the output of the gate 27 remains HIGH, the output of the gate 28 changes to LOW state. On the other hand, the output of the gate 29 remains HIGH. Next, the internal clock signal 65C falls, changing the output of the gate 26 to HIGH state, whereby the gate 27, receiving four inputs which are all HIGH, outputs a LOW state output. As a result, the output of the gate 28 again rises to HIGH from LOW and outputs a pulse signal which has a pulse width which is equal to the phase difference T1 between the external clock signal 73 and the internal clock signal 65C. On the other hand, in response to a change of the output of the gate 26 to HIGH state, the output of the gate 29 tries to change to LOW state in vain since the output of the gate 27 soon changes to LOW state and hence stays at HIGH state.

That is, at a falling edge of a first one to fall of the external clock signal 73 and the internal clock signal 65C, the up signal U falls from HIGH to LOW because of the potentials received directly from the NAND gate 21 to the NAND gate 28. Following this, at a falling edge of a second one to fall of the external clock signal 73 and the internal clock signal 65C, the up signal U rises from LOW to HIGH because of the potentials received through a path which includes the NAND gate 27. This behavior is also true of the down signal D.

Since the phase comparator 14 operates in the above-mentioned manner, even if the wires connecting the front stages 41 and the rear stage 40 are long, delays created on the paths for causing rise and fall of the output of the gate 28 each increase by an amount T2 as shown by the dotted lines in FIG. 7. The pulse width of the resultant up signal U would not be affected by the lengths of the wires which connect the front stages 41 and the rear stage 40. Therefore, the sensitivity of the phase comparator 17 would not be degraded.

Hence, by disposing only the rear stage 40 of the phase comparator 14 in the vicinity of the charge pump 16 and disposing the front stages 41 of the phase comparator 14 in correspondence to the plurality of circuit elements, effects similar to those of the first preferred embodiment are attained. Besides, deterioration in the sensitivity of the phase comparator is suppressed.

Third Preferred Embodiment

Figure 8:
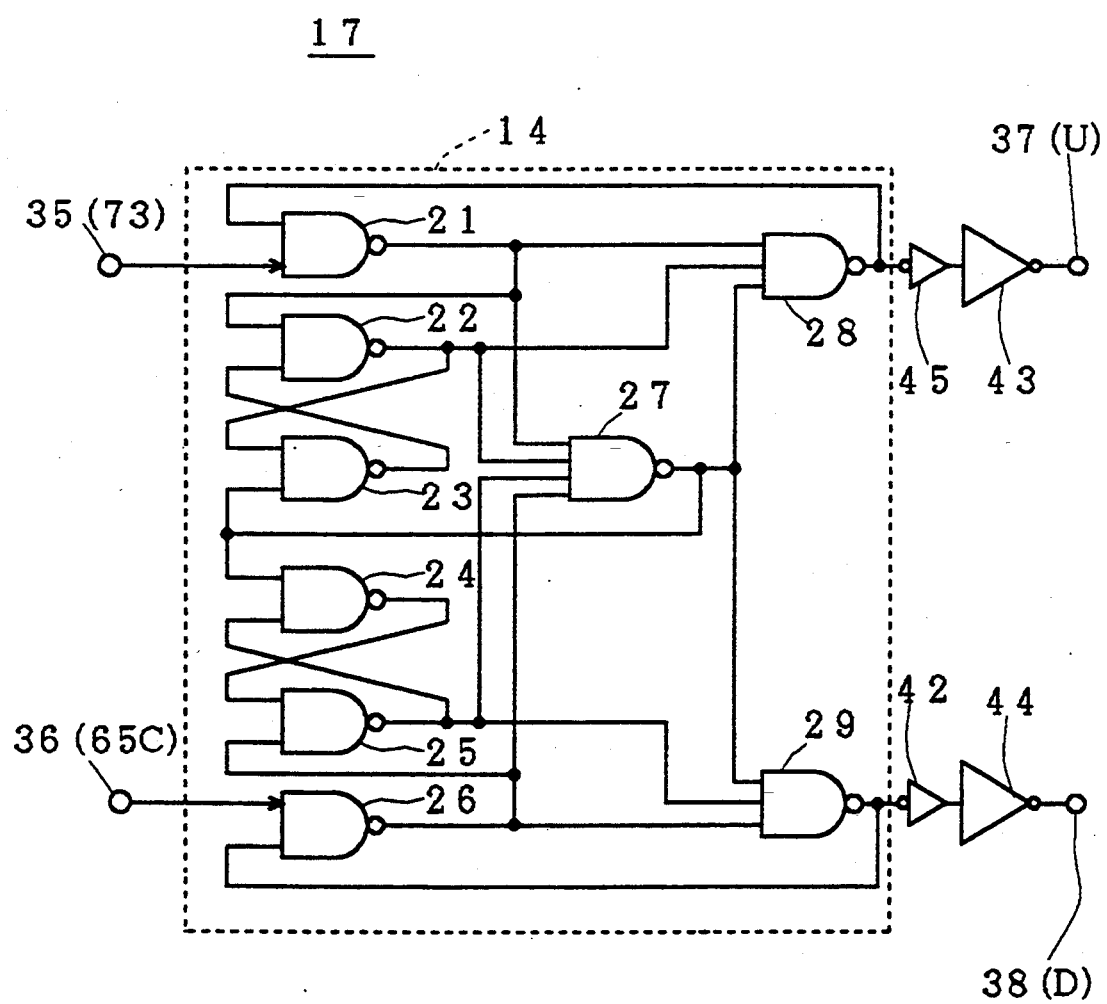
FIG. 8 is a circuitry diagram for explaining a third preferred embodiment of the present invention.

FIG. 8 is a circuitry diagram showing the structure of a phase comparator 17 according to a third preferred embodiment of the present invention. The phase comparator 17 is equivalent to the phase comparator 14 of FIG. 6 as modified such that the up signal U is outputted not directly from the gate 28 but through two invertors 45 and 43.

Likewise in the first preferred embodiment, a plurality of such comparators 17 are provided in correspondence to the plurality of circuit elements. The farther the comparators 17 are from the charge pump circuit 16, the larger current driving capability the invertor 43, which is farther from the gate 28 than the other invertor 45, of each comparator 17 has.

An output of the phase comparator 17 which is located far from the charge pump circuit 16 travels a large distance on a long wire until received by the charge pump circuit 16. The longer the wire is, the larger a parasitic capacitance becomes, which in turn deteriorates the pulse of the up signal U. Therefore, a large driving capability of the up signal U is necessary.

An improved driving capability of the up signal U is attained by using a large size transistor to form either one of the invertors 45 and 43. However, when a large size transistor is used to form the invertor 45, it would be difficult for the gate 28 to drive the invertor 45 in some cases. This is why a large size transistor is used within the invertor 43 as a solution to enhance the driving capability of the phase comparator 17 which is located far from the charge pump circuit 16. This is also true of the down signal D. Of two invertors 42 and 44 which are disposed between the gate 29 and the output terminal 38, the invertor which is farther from the gate 29 is formed by a large size transistor so that each phase comparator 17 has an enhanced current driving capability.

By thus increasing the current driving capability of the phase comparator 17 which is located far from the charge pump circuit 16, deterioration in the pulses of the up signal U and the down signal D is suppressed, effects similar to those of the first preferred embodiment are attained, and the reliability of the semiconductor integrated device is enhanced.

While the invention has been described in detail, the foregoing description is in all aspects illustrative and not restrictive. It is understood that numerous other modifications and variations can be devised without departing from the scope of the invention.

I claim:

1. A semiconductor integrated circuit which is divided into a first region and a second region, said semiconductor integrated circuit, comprising:
   at least one internal circuit disposed within said first region, said internal circuit including a plurality of elements, said internal circuit receiving a basic clock signal and providing internal clock signals to said plurality elements;
   phase adjusting means disposed within said first region in correspondence to each of said at least one internal circuit; and
   a plurality of phase comparing means candidates disposed within said second region in correspondence to said plurality of elements, one of said plurality of phase comparing means candidates being selected as phase comparing means,
   where said phase comparing means receives one of said internal clock signals and an external clock signal which has a reference phase with respect to said one of said internal clock signals, and outputs a phase difference signal which represents a phase difference between said one of said internal clock signals and said external clock signal,
   and wherein each of said phase adjusting means receives said phase difference signal and adjusts said phase difference to a predetermined value.

2. The semiconductor integrated circuit of claim 1, wherein said plurality of phase comparing means candidates are disposed in correspondence to a group of said plurality of elements to which said internal clock signals are provided respectively having a same phase difference from the phase of said external clock signal.

3. The semiconductor integrated circuit of claim 1, wherein each one of said said plurality of phase comparing means candidates is disposed in correspondence to each one of said plurality of elements.

4. The semiconductor integrated circuit of claim 1, wherein said second region is surrounded by said first region.

5. The semiconductor integrated circuit of claim 1, further comprising in said first region a driver circuit which is connected to said phase adjusting means and which generates said basic clock signal.

6. The semiconductor integrated circuit of claim 5, wherein said phase adjusting means includes a charge pump circuit which receives said phase difference signal and outputs a pulse signal which has a pulse width which corresponds to said phase difference signal.

7. The semiconductor integrated circuit of claim 6, wherein said plurality of phase comparing means candidates which are located relatively far from said charge pump each include a semiconductor device having a relatively high driving capability at an end stage thereof,
   and wherein said plurality of phase comparing means candidates which are located relatively near said charge pump each include a semiconductor device having a relatively low driving capability at an end stage thereof.

8. The semiconductor integrated circuit of claim 7, wherein said phase adjusting means further includes a loop filter which receives, smooths and outputs said pulse signal.

9. The semiconductor integrated circuit of claim 8, wherein said phase adjusting means further includes an oscillator for oscillating a signal which has a phase which varies in accordance with a potential which is outputted by said loop filter, and said basic clock signal is generated based on said signal oscillated by said oscillator.

10. A method of designing a semiconductor integrated circuit, comprising the steps of:
    (a) specifying a subject region to be designed;
    (b) dividing said subject region into a first region and a second region;
    (c) designing in said first region:
       at least one internal circuit which includes a plurality of elements, said internal circuit receiving a basic clock signal and providing internal clock signals to said elements; and
       phase adjusting means which corresponds to each of said at least one internal circuit;
    (d) in said second region, designing a plurality of phase comparing means candidates which correspond to said plurality of elements, one of said plurality of phase comparing means candidates being selected as phase comparing means;
    (e) specifying one of said at least one internal circuit which receives one of said internal clock signals which is to be adjusted in terms of phase; and
    (f) specifying one of said plurality of phase comparing means candidates which corresponds to said one of said internal circuits as said phase comparing means,
    wherein in response to said one of said internal clock signals which is given to said one of said at least one internal circuit and an external clock signal which has a reference phase with respect to said one of said internal clock signals, said phase comparing means outputs a phase difference signal which represents a phase difference between said one of said internal clock signals and said external clock signal,
    and wherein each of said phase adjusting means receives said phase difference signal and adjusts said phase difference to a predetermined value.

11. The method of designing a semiconductor integrated circuit of claim 10, wherein said phase adjusting means includes a charge pump circuit which receives said phase difference signal and outputs a pulse signal which has a pulse width which corresponds to said phase difference signal, said plurality of phase comparing means includes a semiconductor element at an output stage thereof, and said method further comprises the step of (g) redesigning so that said semiconductor element has a larger driving capability if one of said plurality of phase comparing means candidates which is located relatively far from said charge pump circuit is selected as said phase comparing means than if one of said phase comparing means candidates which is located relatively near said charge pump circuit is selected as said phase comparing means.

12. A method of designing a semiconductor integrated circuit, comprising the steps of:
  (a) specifying a subject region to be designed;
  (b) dividing said subject region into a first region and a second region;
  (c) designing in said first region:
    at least one internal circuit which includes a plurality of elements, said at least one internal circuit receiving a basic clock signal and providing internal clock signals to said elements; and
    phase adjusting means which corresponds to said at least one internal circuit;
  (d) in said second region, designing a plurality of phase comparing means location candidates one of which is to be specified as a mounting location at which phase comparing means is to be disposed;
  (e) specifying one of said at least one internal circuit which receives one of said internal clock signals which is to be adjusted in terms of phase; and
  (f) designing said phase comparing means at one of said phase comparing means location candidates which corresponds to said one of said internal circuits,
  wherein in response to said one of said internal clock signals which is given to said one of said at least one internal circuit and an external clock signal which has a reference phase with respect to said one of said internal clock signals, said phase comparing means outputs a phase difference signal which represents a phase difference between said one of said internal clock signals and said external clock signal,
  and wherein each of said phase adjusting means receives said phase difference signal and adjusts said phase difference to a predetermined value.

13. A method of manufacturing a semiconductor integrated circuit, comprising the steps of:
  (a) specifying a subject region on a semiconductor substrate;
  (b) dividing said subject region into a first region and a second region;
  (c) forming in said first region:
    at least one internal circuit which includes a plurality of elements, said internal circuit receiving a basic clock signal and providing internal clock signals to said plurality of elements; and
    phase adjusting means which corresponds to each of said at least one internal circuit;
  (d) in said second region, forming a plurality of phase comparing means candidates which correspond to said plurality of elements, one of said plurality of phase comparing means candidates being selected as phase comparing means;
  (e) specifying one of said at least one internal circuit which receives one of said internal clock signals which is to be adjusted in terms of phase;
  (f) specifying one of said plurality of phase comparing means candidates which corresponds to said one of said internal circuits as said phase comparing means; and
  (g) connecting said phase comparing means to said phase adjusting means,
  wherein in response to said one of said internal clock signals which is given to said one of said at least one internal circuit and an external clock signal which has a reference phase with respect to said one of said internal clock signals, said phase comparing means outputs a phase difference signal which represents a phase difference between said one of said internal clock signals and said external clock signal,
  and wherein each of said phase adjusting means receives said phase difference signal and adjusts said phase difference to a predetermined value.

14. A method of manufacturing a semiconductor integrated circuit, comprising the steps of:
  (a) specifying a subject region on a semiconductor substrate;
  (b) dividing said subject region into a first region and a second region;
  (c) forming in said first region:
    at least one internal circuit which includes a plurality of elements, said internal circuit receiving a basic clock signal and providing internal clock signals to said elements; and
    phase adjusting means which corresponds to each said at least one internal circuit;
  (d) in said second region, forming a plurality of phase comparing means location candidates one of which is to be specified as a mounting location at which phase comparing means is to be disposed;
  (e) specifying one of said at least one internal circuit which receives one of said internal clock signals which is to be adjusted in terms of phase; and
  (f) forming said phase comparing means at one of said phase comparing means location candidates which corresponds to said one of said internal circuits; and
  (g) connecting said phase comparing means to said phase adjusting means,
  wherein in response to said one of said internal clock signals which is given to said one of said at least one internal circuit and an external clock signal which has a reference phase with respect to said one of said internal clock signals, said phase comparing means outputs a phase difference signal which represents a phase difference between said one of said internal clock signals and said external clock signal,
  and wherein each of said phase adjusting means receives said phase difference signal and adjusts said phase difference to a predetermined value.

15. A semiconductor integrated circuit which is divided into a first region and a second region, said semiconductor integrated circuit, comprising:
  at least one internal circuit disposed within said first region, said internal circuit including a plurality of elements, said internal circuit receiving a basic clock signal and providing internal clock signals to said elements;
  phase adjusting means and first phase comparing means disposed within said first region in correspondence to each said at least one internal circuit; and
  a plurality of phase comparing means candidates disposed within said second regions in correspondence to said elements, one of said plurality of phase comparing means candidates being selected as second phase comparing means,
  wherein said second phase comparing means receives one of said internal clock signals and an external clock signal which has a reference phase with respect to said one of said internal clock signals, and outputs a plurality of transition signals which represents transitions of said one of said internal clock signals and said external clock signal, wherein said first phase comparing means, in response to said plurality of transition signals, outputs a phase difference signal which represents a phase difference between said one of said internal clock signals and said external clock signal, and wherein each of said phase adjusting means receives said phase difference signal and adjusts said phase difference to a predetermined value.

16. The semiconductor integrated circuit of claim 15, wherein said one of said internal clock signals and said external clock signal both have a first logic level or a second logic level which are different from each other, and wherein said plurality of transition signals have:
- a first signal for performing second transition at first transition of said external clock signal, said first transition being a transition from said first logic level to said, second logic level, said second transition being a transition from said second logic level to said first logic level;
- a second signal for performing said second transition at said first transition of said one of said internal clock signals; and
- a third signal for performing said first transition at a later one of said second transition of said first signal and said second transition of said second signal.

17. The semiconductor integrated circuit of claim 16, wherein said phase difference signal has:
- a fourth signal for performing said first transition at said second transition of said first signal; and
- a fifth signal for performing said first transition at said second transition of said second signal, wherein after performing said first transition, said fourth signal performs said second transition in response to said first transition of said third signal, and wherein after performing said first transition, said fifth signal performs said second transition in response to said first transition of said fourth signal.

18. The semiconductor integrated circuit of claim 17, wherein each said at least one phase adjusting means:
- in response to said first and said second transitions of said fourth signal, causes the phase of said basic clock signal to lead; and
- in response to said first and said second transitions of said fifth signal, causes the phase of said basic clock signal to lag behind.

19. The semiconductor integrated circuit of claim 17, wherein said second phase comparing means comprises:
- a first gate which is controlled by said fourth signal and which generates said first signal from said external clock signal;
- a second gate which is controlled by said fifth signal and which generates said second signal from one of said internal clock signals;
- a first flip-flop which is set by said first signal and reset by said third signal;
- a second flip-flop which is set by said second signal and reset by said third signal; and
- a third gate for generating said third signal from outputs of said first and said second flip-flops, said first gate and said second gate.

20. The semiconductor integrated circuit of claim 19, wherein said first phase comparing means comprises:
- a fourth gate for generating said fourth signal from said first signal, said third signal and an output of said first flip-flop; and
- a fifth gate for generating said fifth signal from said second signal, said third signal and an output of said second flip-flop.

21. The semiconductor integrated circuit of claim 20, wherein said first and said second gates are NAND gates.

22. The semiconductor integrated circuit of claim 21, wherein said third gate is a NAND gate.

23. The semiconductor integrated circuit of claim 22, wherein said fourth and said fifth gates are NAND gates.

24. The semiconductor integrated circuit of claim 23, wherein said first flip-flop comprises:
- a sixth gate including a first input terminal for receiving said first signal, a second input terminal and an output terminal for providing said fourth gate with an inversion of logical products which are received at its first and said second input terminals; and
- a seventh gate including a first input terminal for receiving said third signal, a second input terminal connected to said output terminal of said sixth gate and an output terminal for providing said second input terminal of said sixth gate with an inversion of logical products which are received at its first and said second input terminals.

25. The semiconductor integrated circuit of claim 24, wherein said second flip-flop comprises:
- an eighth gate including a first input terminal for receiving said second signal, a second input terminal and an output terminal for providing said fifth gate with an inversion of logical products which are received at its first and said second input terminals; and
- a ninth gate including a first input terminal for receiving said third signal, a second input terminal connected to said output terminal of said eighth gate and an output terminal for providing said second input terminal of said eighth gate with an inversion of logical products which are received at its first and said second input terminals.

26. A method of designing a semiconductor integrated circuit, comprising the steps of:
(a) specifying a subject region to be designed;
(b) dividing said subject region into a first region and a second region;
(c) designing in said first region:
  at least one internal circuit which includes a plurality of elements, said internal circuit receiving a basic clock signal and providing internal clock signals to said plurality of elements; and
  phase adjusting means and first phase comparing means both of which correspond to each said at least one internal circuit;
(d) in said second region, designing a plurality of phase comparing means candidates which correspond to said elements, one of said plurality of phase comparing means candidates being selected as second phase comparing means;
(e) specifying one of said at least one internal circuit which receives one of said internal clock signals which, is to be adjusted in terms of phase; and
(f) specifying one of said phase comparing means candidates which corresponds to said one of said internal circuits as said second phase comparing means, wherein said second phase comparing means receives said one of said internal clock signals and an external clock signal which has a reference phase with respect to said one of said internal clock signals, and outputs a plurality of transition signals which represent transitions of said one of said internal clock signals and said external clock signal, wherein said first phase comparing means in response to said transition signal outputs a phase difference signal which represents a phase difference between said one of said internal clock signals and said external clock signal, and wherein each of said phase adjusting means receives said phase difference signal and adjusts said phase difference to a predetermined value.

27. A method of designing a semiconductor integrated circuit, comprising the steps of:
(a) specifying a subject region to be designed;
(b) dividing said subject region into a first region and a second region;
(c) designing in said first region:
at least one internal circuit which includes a plurality of elements, said internal circuit receiving a basic clock signal and providing internal clock signals to said elements; and
phase adjusting means and first phase comparing means both of which correspond to each said at least one internal circuit;
(d) in said second region, designing a plurality of third regions one of which is to be specified as a mounting location at which second phase comparing means is to be disposed;
(e) specifying one of said at least one internal circuit which receives one of said internal clock signals which is to be adjusted in terms of phase; and
(f) designing said second phase comparing means at one of said third regions which corresponds to said one of said internal circuits, wherein said second phase comparing means receives said one of said internal clock signals and an external clock signal which has a recreance phase with respect to said one of said internal clock signals, and outputs a plurality of transition signals which represent transitions of said one of said internal clock signals and said external clock signal, wherein said first phase comparing means in response to said transition signal outputs a phase difference signal which represents a phase difference between said one of said internal clock signals and said external clock signal, and wherein each of said phase adjusting means receives said phase difference signal and adjusts said phase difference to a predetermined value.

28. A method of manufacturing a semiconductor integrated circuit, comprising the steps of:
(a) specifying a subject region to be designed;
(b) dividing said subject region into a first region and a second region;
(c) in said first region, forming:
at least one internal circuit which includes a plurality of elements, said internal circuit receiving a basic clock signal and providing internal clock signals to said elements; and
phase adjusting means and first phase comparing means both of which correspond to each said at least one internal circuit;
(d) in said second region, forming a plurality of phase comparing means candidates which correspond to said elements, one of said plurality of phase comparing means candidates being selected as second phase comparing means;
(e) specifying one of said at least one internal circuit which receives one of said internal clock signals which is to be adjusted in terms of phase;
(f) specifying one of said phase comparing means candidates which corresponds to said one of said internal circuits as said second phase comparing means; and
(g) connecting together said second phase comparing means, said first phase comparing means and said phase adjusting means, wherein said second phase comparing means receives said one of said internal clock signals and an external clock signal which has a reference phase with respect to said one of said internal clock signals, and outputs a plurality of transition signals which represent transitions of said one of said internal clock signals and said external clock signal, wherein said first phase comparing means in response to said transition signal outputs a phase difference signal which represents a phase difference between said one of said internal clock signals and said external clock signal, and wherein each of said phase adjusting means receives said phase difference signal and adjusts said phase difference to a predetermined value.

29. A method of manufacturing a semiconductor integrated circuit, comprising the steps of:
(a) specifying a subject region to be designed;
(b) dividing said subject region into a first region and a second region;
(c) in said first region, forming:
at least one internal circuit which includes a plurality of elements, said internal circuit receiving a basic clock signal and providing internal clock signals to said elements; and
phase adjusting means and first phase comparing means both of which correspond to each said at least one internal circuit;
(d) in said second region, specifying a plurality of third regions one of which is to be specified as a mounting location at which second phase comparing means is to be disposed;
(e) specifying one of said at least one internal circuit which receives one of said internal clock signals which is to be adjusted in terms of phase;
(f) forming said second phase comparing means at one of said third regions which corresponds to said one of said internal circuits; and
(g) connecting together said second phase comparing means, said first phase comparing means and said phase adjusting means, wherein said second phase comparing means receives said one of said internal clock signals and an external clock signal which has a reference phase with respect to said one of said internal clock signals, and outputs a plurality of transition signals which represent transitions of said one of said internal clock signals and said external clock signal, wherein said first phase comparing means in response to said transition signal outputs a phase difference signal which represents a phase difference between said one of said internal clock signals and said external clock signal, and wherein each of said phase adjusting means receives said phase difference signal and adjusts said phase difference to a predetermined value.

* * * * *